(12) United States Patent
Sha et al.

(10) Patent No.: US 12,014,123 B2
(45) Date of Patent: Jun. 18, 2024

(54) SYSTEM AND METHOD FOR PREDICTING VIBRATION OF BICYCLE WHEN BEING RODE ON ROAD

(71) Applicant: CHANG'AN UNIVERSITY, Xi'an (CN)

(72) Inventors: Aimin Sha, Xi'an (CN); Jie Gao, Xi'an (CN); Bo Luan, Xi'an (CN); Liqun Hu, Xi'an (CN); Wei Jiang, Xi'an (CN)

(73) Assignee: CHANG'AN UNIVERSITY, Xi'an (CN)

( * ) Notice: Subject to any disclaimer, the term of this patent is extended or adjusted under 35 U.S.C. 154(b) by 747 days.

(21) Appl. No.: 17/159,176

(22) Filed: Jan. 27, 2021

(65) Prior Publication Data

US 2021/0150103 A1 May 20, 2021

Related U.S. Application Data

(63) Continuation of application No. PCT/CN2018/125777, filed on Dec. 29, 2018.

(30) Foreign Application Priority Data

Nov. 22, 2018 (CN) .......................... 201811399621.6

(51) Int. Cl.
*G06F 30/17* (2020.01)
*G01J 5/00* (2022.01)

(52) U.S. Cl.
CPC ................ *G06F 30/17* (2020.01); *G01J 5/00* (2013.01); *G01J 2005/0077* (2013.01)

(58) Field of Classification Search
CPC ...... G06F 30/17; G01J 5/00; G01J 2005/0077
(Continued)

(56) References Cited

U.S. PATENT DOCUMENTS

| 4,092,869 A * | 6/1978 | Kimball .................. G01M 7/02 374/57 |
| 6,986,521 B1 * | 1/2006 | Li .......................... B62K 19/00 280/281.1 |

(Continued)

FOREIGN PATENT DOCUMENTS

| CN | 2566256 Y | 8/2003 | |
| CN | 279806 | * 7/2006 | .............. G01M 7/02 |

(Continued)

OTHER PUBLICATIONS

Xie et al. ("Measurement of dynamic vibration in cycling using portable terminal measurement system", IET Intelligent Transport Systems, 2018, pp. 469-474) (Year: 2018).*

(Continued)

*Primary Examiner* — Iftekhar A Khan
(74) *Attorney, Agent, or Firm* — W&G Law Group

(57) ABSTRACT

The disclosure discloses a system and method for predicting a vibration of a bicycle when being rode on a road. The method first uses a pressure film to obtain a contact interface between a road and a bicycle tire, and then, based on the contact interface, a unit bearing area ($B_u$) and an average stress peak distance ($Sp_a$) are calculated. Next, taking the above parameters as variables, a predicted vibration value ($P_v$) is calculated based on calculation formulas provided by the present disclosure. Finally, the predicted vibration value $P_v$ is compared with a comfort-level threshold perceived by a cyclist of the present disclosure, which can quickly and effectively grade and predict a comfort level when riding a bicycle on a section of an asphalt road.

4 Claims, 3 Drawing Sheets

(58) Field of Classification Search
USPC .......................................................... 703/1
See application file for complete search history.

(56) References Cited

U.S. PATENT DOCUMENTS

| | | | | |
|---|---|---|---|---|
| 8,960,389 | B2* | 2/2015 | McAndrews | B62K 25/08 188/322.22 |
| 2008/0315553 | A1* | 12/2008 | Girout | B62K 25/02 280/281.1 |
| 2009/0243254 | A1* | 10/2009 | Chiang | H02N 2/186 280/281.1 |
| 2012/0316800 | A1* | 12/2012 | Shteinhauz | G01M 17/025 702/56 |
| 2014/0159336 | A1* | 6/2014 | Yu | B32B 1/08 280/283 |
| 2017/0059461 | A1* | 3/2017 | Klucha | B62K 19/16 |
| 2018/0251097 | A1* | 9/2018 | Masaki | B62H 5/20 |

FOREIGN PATENT DOCUMENTS

| | | |
|---|---|---|
| CN | 2798069 Y | 7/2006 |
| CN | 101909909 A | 12/2010 |
| CN | 102432228 A | 5/2012 |
| CN | 103512759 A | 1/2014 |
| CN | 204214626 U | 3/2015 |
| CN | 204330358 U | 5/2015 |
| CN | 106934119 A | 7/2017 |
| CN | 107290156 A | 10/2017 |
| CN | 107560873 A | 1/2018 |
| JP | 2004001714 A | 1/2004 |
| JP | 2006317227 A | 11/2006 |
| KR | 20110108867 A | 10/2011 |
| KR | 101554285 B1 | 9/2015 |
| TW | I296707 B | 5/2008 |

OTHER PUBLICATIONS

Bil et al. ("How comfortable are your cycling tracks? A new method for objective bicycle vibration measurement", Transportation Research Part C 56 (2015) 415-425) (Year: 2015).*
Joo et al. ("A novel method to monitor bicycling environments", Transportation Research Part A 54 (2013) 1-13) (Year: 2013).*
International Search Report (PCT/CN2018/125777); Date of Mailing: Aug. 14, 2019.
First Office Action (201811399621.6); Date of Mailing: Jun. 2, 2020.

* cited by examiner

SYSTEM AND METHOD FOR PREDICTING VIBRATION OF BICYCLE WHEN BEING RODE ON ROAD

CROSS-REFERENCE TO RELATED APPLICATIONS

This application is a continuation of International Application No. PCT/CN2018/125777 filed on Dec. 29, 2018, which claims priority to Chinese Patent Application No. 201811399621.6, filed on Nov. 22, 2018. The disclosures of the aforementioned applications are hereby incorporated by reference in their entireties.

TECHNICAL FIELD

The present disclosure relates to the technical field of transportation engineering, and in particular, to a system and method for predicting a vibration of a bicycle when being rode on a road.

BACKGROUND

Up to now, the urban transportation planning in China has been carried out and implemented on basis of motorized transportation. To a certain extent, urban road planning dominated by motorized transportation has led to traffic jam, air pollution, and large consumption of petrochemical energy. As a type of environment-friendly transportation mean with no carbon emission, gonging out with bicycles has been paid more and more attention all over the world. After 2015, shared bicycle industry in China has ushered in a period of rapid development, and as a result, more and more people choose bicycles as main transportation means. The latest data has shown that up to 2018, more than 77 shared bicycle operators in China have provided 23 million shared bicycles for nearly 400 million users, and more than 1.7 billion people have experienced shared bicycle services.

As we all know, surface textures of asphalt roads that are widely used in cities of China are quite different from each other due to a type of asphalt mixture, material characteristics and construction technology, and as a result, riding a bicycle on these roads lead to different comfort levels. It is generally believed that the rougher the surface texture of the asphalt road is, the more significant the vibration perceived by the cyclist during riding the bicycle is. Studies have shown that the excessively violent vibration prevents people from being willing to travel by bicycles, and that it is detrimental to the cyclist's health when being subjected to long-term and high-intensity vibrations.

However, the urban road construction standards dominated by motorized transportation do not fully take the comfort levels perceived by the cyclists into account. With development of society and popularization of a "people-oriented" concept in urban construction, more and more people have paid attention to the comfort levels when riding the bicycle. Moreover, at present, there is no corresponding standards or researches to teach material design of asphalt concrete bicycle lanes and evaluation of comfort levels perceived when riding a bicycle on existing asphalt roads. Therefore, technical solutions proposed by the present disclosure are quite necessary.

SUMMARY

In order to solve the above problems, the present disclosure provides a system and a method for predicting a vibration of a bicycle when being rode on a road, which can quantitatively and accurately evaluate comfort levels perceived when riding a bicycle on an asphalt road based on characteristics of a contact interface between the asphalt road and a bicycle tire.

In order to achieve the above object, the technical solution adopted by the present disclosure is as follows. A system for predicting a vibration of a bicycle when being rode on a road includes the bicycle, a support frame, an infrared thermal imager, a humidity sensor, a fixing belt, a level bubble and a pressure film. The support frame is arranged on the road and configured to support a rear wheel of the bicycle in such a manner that the rear wheel of the bicycle is off the ground. The fixing belt is configured to fix spokes of a front wheel and a front fork of the bicycle to prevent the front wheel from rotating during a test. The infrared thermal camera is arranged on the road and configured to measure a surface temperature of the road in a road test zone. The humidity sensor is configured to measure a relative surface humidity of the road in the road test zone. The level bubble is installed on the front fork of the bicycle. The pressure film is arranged in the road test zone, and the front wheel of the bicycle is pressed against the pressure film at the beginning of the test.

Further, the pressure film has a dimension having a width ranging from 10 cm to 15 cm and a length ranging from 15 cm to 25 cm, a measuring range of a pressure test of the pressure film ranges from 0.5 MPa to 2.5 MPa, and a unit area of a dyeing unit on the pressure film is smaller than or equal to 0.016 $mm^2$.

Further, the bicycle has a weight ranging from 10 kg to 25 kg.

The present disclosure further provides a method for predicting a vibration of a bicycle when being rode on a road, applied to the system for predicting the vibration of the bicycle when being rode on the road, and the method includes:

a step S1 of removing sundries covering a surface of a tested asphalt road;

a step S2 of measuring the surface temperature of the road in the road test zone by the infrared thermal camera and measuring the relative surface humidity of the road by the humidity sensor;

a step S3 of placing the rear wheel of the bicycle onto the support frame and fixing the spokes of the front wheel and the front fork of the bicycle together by the fixing belt to avoid a deviation generated during the test;

a step S4 of cutting the pressure film into a required dimension, and arranging the pressure film steadily at a test point in such a manner that the pressure film is not in contact with a front tire of the bicycle and the front tire of the bicycle is next to the pressure film before the test;

a step S5 of first straddling, by a tester, the bicycle and adjusting an angle of the front tire of the bicycle by observing the level bubble, and then placing, by the tester, the front tire of the bicycle onto the pressure film vertically when it is determined that the front tire of the bicycle is perpendicular to the road;

a step S6 of sitting, by the tester, on a saddle of the bicycle, and keeping the tester in a test state stable for a specified period;

a step S7 of removing, by a cyclist, the front tire of the bicycle, and taking away the pressure film and saving the pressure film in a dark environment; and repeating the step S1 through the step S7 to measure at least three pressure films at different positions of each tested road section, and then ending an outdoor test;

a step S8 of digitizing each of the obtained pressure films through a scanner with a scanning mode of a grayscale mode, wherein information recorded by the pressure film in the grayscale mode is converted into grayscale value ranging from 1 to 255, and a scanning quality is greater than or equal to 600*600 dpi;

a step S9 of determining a unit pixel area of each of the digitized pressure films based on Formula 1;

$$R_p = \frac{w \times l}{p_w \times p_l},\qquad \text{Formula 1}$$

where Rp represents an area of one pixel of the digitized pressure film in a real world and has a unit of mm²; w and l respectively represents a width and a length of the pressure film in the real world and have a unit of mm, and $p_w$ and $p_l$ respectively represent a number of pixels in a direction of the width of the digitized pressure film and a number of pixels in a direction of the length of the digitized pressure film;

a step S10 of calculating an average bearing area $B_u$, wherein the average bearing area $B_u$ is defined as a ratio of a contact area $A_c$ to a number $n_k$ of granular contact regions in a contact interface recorded by each of the digitized pressure films; and first, the contact area $A_c$ between the road and a bicycle tire is calculated based on Formula 2, and then the average bearing area $B_u$ is calculated based on Formula 3, $$A_c = p \times R_p; \text{ and} \qquad \text{Formula 2}$$

$$B_u = \frac{A_c}{n_k}, \qquad \text{Formula 3}$$

where p represents a total number of pixels of each of the digitized pressure films whose grayscale is not equal to 255, and $n_k$ represents a number of regions of the digitized pressure film which are distributed in a granular manner;

a step S11 of calculating an average stress peak distance $Sp_a$, wherein five grayscale value distribution curves are extracted from each of the digitized pressure films along a forward riding direction by using a digital image analysis software, and as is shown in FIG. 2, each of the five grayscale value distribution curves is subjected to a lowpass filtering to improve precision for recognizing a stress peak; according to an inverse correspondence between a grayscale value and a stress value, a grayscale valley corresponds to a stress peak; and the five grayscale value distribution curves are taken every 0.5 cm along a width direction of an image, the average stress peak distance $Sp_a$ of each of the five grayscale value distribution curves is calculated based on Formula 4, and an average value of the calculated $Sp_a$ of the five grayscale value distribution curves is reserved, $$Sp_a = \frac{\sum_{i=1}^{n}(x_{i+1} - x_i)}{n}, \qquad \text{Formula 4}$$

where n represents a number of stress peaks of one grayscale distribution curve, and $x_{i+1}$ and $x_i$ respectively represent a coordinate of an $(i+1)^{th}$ stress peak and a coordinate of an $i^{th}$ stress peak on an x-axis in the forward riding direction; and a step S12 of calculating a predicted vibration value $P_v$, wherein $Sp_a$ and $B_u$ are substituted into Formula 5 to calculate the predicted vibration value $P_v$ (m/s²), $$p_v = 0.145 \times B_u + 0.404 \times Sp_a - 1.155 \qquad \text{Formula 5.}$$

Further, the test is carried out when the surface temperature of the road is within a range from 15° C. to 30° C. and the relative surface humidity is within a range from 20% to 70%.

Further, the specified period in the step S6 is 2 minutes.

Further, the method further includes:

a step S13 of determining a comfort level when riding the bicycle on the tested road section by comparing the vibration value with a comfort-level threshold.

Compared with the prior art, the present disclosure has at least the following beneficial effects.

1. The technical solution disclosed in the present disclosure can be carried out without a complicated test process and expensive test instruments, and can quickly, efficiently and accurately determine the comfort level when riding a bicycle on the asphalt road.
2. The implementation of the present disclosure is conducive to detecting and monitoring for a performance of a bicycle lane in terms of riding a bicycle. Through regular detections, road sections with low comfort levels can be repaired and maintained in time to guarantee the comfort level perceived when riding a bicycle on the bicycle lane.
3. The present disclosure can provide necessary references for the bicycle lane builders to select the asphalt mixture. After the employed asphalt mixture is formed, the technical solution provided by the present disclosure can verify whether the selected material is suitable for pavement of bicycle lanes.

DESCRIPTION OF EMBODIMENTS

In order to better illustrate purposes and advantages of the present disclosure, the present disclosure is described in details in the following with reference to embodiments. It should be understood that the embodiments described here are merely for illustrating rather than limiting the present disclosure.

Figure 6:
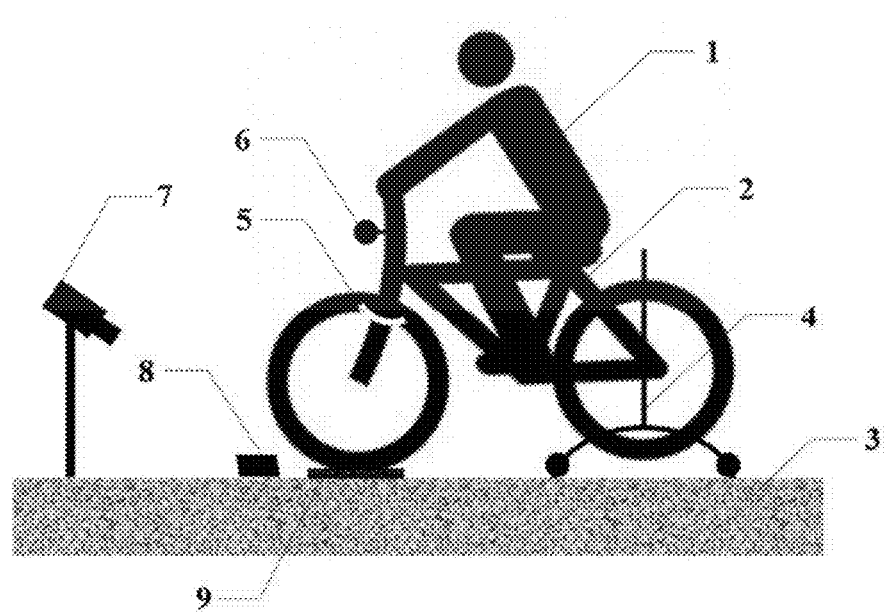
FIG. 6 illustrates a schematic diagram of a system provided by the present disclosure.

As shown in FIG. 6, a system for predicting a vibration of a bicycle when being rode on a road provided by the present disclosure includes the bicycle 2, a support frame 4, an infrared thermal camera 7, a humidity sensor 8, a fixing belt 5, a level bubble 6 and a pressure film 9. The support frame 4 is disposed on a road and configured to support a rear wheel of the bicycle 2 in such a manner that the rear wheel of the bicycle 2 is off the ground. The fixing belt 5 is configured to fix spokes of a front wheel and a front fork of the bicycle 2, so as to prevent the front wheel from rotating during a test. The infrared thermal camera 7 is disposed on the road and configured to measure a surface temperature of the road in a road test zone. The humidity sensor 8 is configured to measure a relative surface humidity of the road in the road test zone. The level bubble 6 is installed on the front fork of the bicycle 2. The pressure film is disposed in the road test zone, and at beginning of the test, the front wheel of the bicycle 2 is pressed against the pressure film 9.

In an embodiment of the present disclosure, the pressure film 9 has a dimension having a width ranging from 10 cm to 15 cm and a length ranging from 15 cm to 25 cm, a measuring range of a pressure test of the pressure film 9 is from 0.5 MPa to 2.5 MPa, and a unit area of a dyeing unit on the pressure film is smaller than or equal to than 0.016 mm². The bicycle has a weight ranging from 10 kg to 25 kg. The tester 1 has a weight ranging from 45 kg to 100 kg.

A method for predicting a vibration of a bicycle when being rode on a road of the present disclosure includes following steps.

At a step S1, sundries such as dust, leaves and garbage, which cover a surface of a tested asphalt road 3, are removed.

At a step S2, the surface temperature of the road in the road test zone is measured by the infrared thermal camera 7, and the relative surface humidity of the road is measured by the humidity sensor 8. The test can be carried out when the surface temperature of the road is within a range from 15° C. to 30° C. and the relative surface humidity is within a range from 20% to 70%.

At a step S3, the rear wheel of the bicycle is arranged on the support frame 4, and the spokes of the front wheel and the front fork of the bicycle are fixed together by the fixing belt 5, so as to avoid a deviation generated during the test.

At a step S4, the pressure film is cut to a required dimension, a recommended dimension has a width ranging from 10 cm to 15 cm and a length ranging from 15 cm to 25 cm, and the pressure film 9 is steadily arranged at a test point. Before the test starts, the pressure film is not in contact with a front tire of the bicycle which is arranged next to the pressure film at this moment. A measuring range of a pressure test of the pressure film is from 0.5 MPa to 2.5 MPa, and a unit area of a dyeing unit on the pressure film is smaller than or equal to 0.016 mm².

At a step S5, the tester 1 first straddles the bicycle 2 and adjusts an angle of the front tire of the bicycle by observing the level bubble 6. When it is determined that the front tire of the bicycle is perpendicular to the road, the tester places the front tire of the bicycle vertically onto the pressure film. In this embodiment, the tester has a weight of 75 kg 3 kg, and the bicycle has a weight ranging from 10 kg to 25 kg.

At a step S6, subsequently, the tester sits steadily on a saddle of the bicycle and keeps a test state stable for 2 minutes.

At a step S7, the cyclist removes the front tire of the bicycle and takes away the pressure film, and saves it in a dark environment. At different positions of each tested road section, at least three pressure films are measured according to a sequence from the step S1 to the step S7, and the following test results adopt an average value obtained from three pressure films. Then an outdoor test ends.

Figure 1:
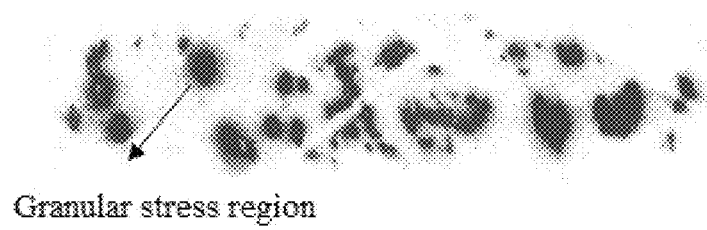
FIG. 1 illustrates a digitized pressure film.

At a step S8, the obtained pressure film is digitized through a scanner with a scanning mode of a grayscale mode, and a scanning quality is greater than or equal to 600*600 dpi. The digitized pressure film is shown in FIG. 1, in which a granular contact region is defined as shown in FIG. 1.

At a step S9, a unit pixel area of the digitized pressure film is determined based on Formula 1 so as to provide a basis for subsequent calculation.

$$R_p = \frac{w \times l}{p_w \times p_l},\quad \text{Formula 1}$$

where Rp represents an area of one pixel of the digitized pressure film in a real world and has a unit of mm², w and l respectively represent a width and a length of the pressure film in the real world and have a unit of mm, and $p_w$ and $p_l$ respectively represent a number of pixels in a direction of the width of the digitized pressure film and a number of pixels in a direction of the length of the digitized pressure film.

At a step S10, an average bearing area $B_u$ is calculated. First, a contact area $A_c$ between the road and the bicycle tire is calculated based on Formula 2, and then the average bearing area $B_u$ is calculated based on Formula 3.

$$A_c = p \times R_p; \text{ and} \quad \text{Formula 2}$$

$$B_u = \frac{A_c}{n_k},\quad \text{Formula 3}$$

where p represents a total number of pixels of the digitized pressure film whose grayscale is not equal to 255, and $n_k$ represents a number of regions of the digitized pressure film which are distributed in a granular manner.

Figure 2:
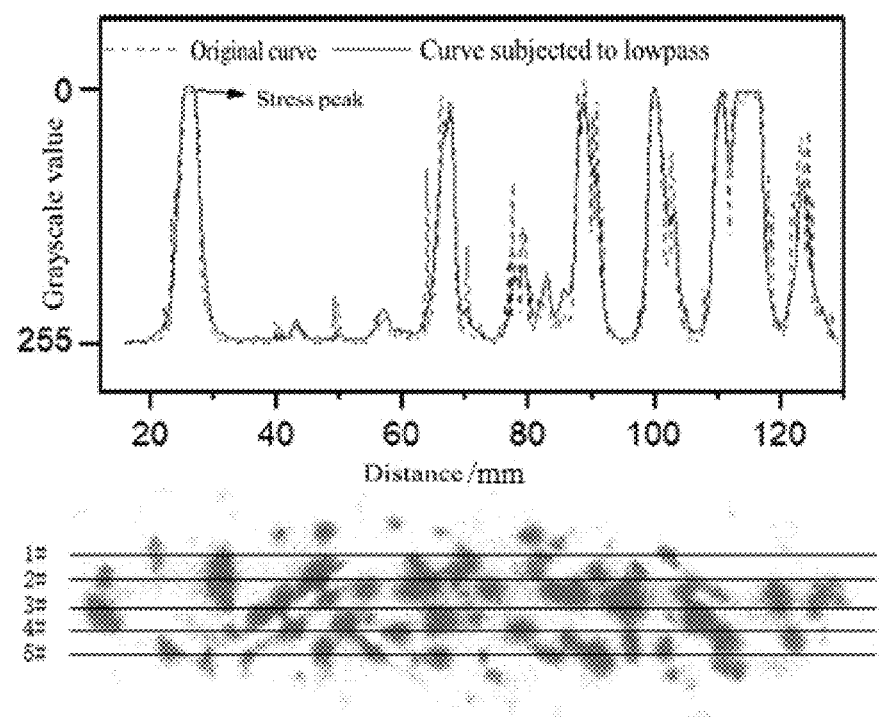
FIG. 2 illustrates an example of curve extraction and curve filtering involved in a calculation process of $Sp_a$.

At a step S11, an average stress peak distance $Sp_a$ is calculated. Five grayscale value distribution curves are extracted from the digitized pressure film along a forward riding direction by using a digital image analysis software. Each curve is subjected to a lowpass filtering to improve precision for recognizing a stress peak. According to an inverse correspondence between a grayscale value and a stress value, a grayscale valley will correspond a stress peak grayscale. The five grayscale value distribution curves are taken every 0.5 cm along a width direction of an image. The above contents are shown in FIG. 2. The average stress peak distance $Sp_a$ of each curve is calculated based on Formula 4, and an average value of $Sp_a$ of the five grayscale value distribution curves is reserved.

$$Sp_a = \frac{\sum_{i=1}^{n}(x_{i+1} - x_i)}{n},\quad \text{Formula 4}$$

where n represents a number of stress peaks of one grayscale distribution curve, and $x_{i+1}$ and $x_i$ respectively represent a coordinate of an $(i+1)^{th}$ stress peak and a coordinate of an $i^{th}$ stress peak on an x-axis in the forward riding direction.

Figure 3:
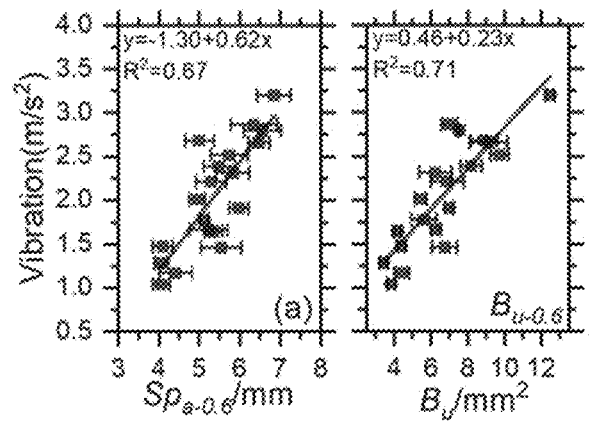
FIG. 3 illustrates a relationship between $B_u$ and predicted vibration values and a relationship between $Sp_a$ and predicted vibration values.

At a step S12, a predicted vibration value $P_v$ is calculated. A relationship between $Sp_a$ and the predicted vibration value $P_v$ (m/s²) and a relationship between $B_u$ and the predicted vibration value $P_v$ (m/s²), as shown in FIG. 3, are obtained after a large number of preliminary experimental studies. According to the above relationships, a multivariate linear regression formula is established and as illustrated by the Formula 5, and a mathematical relationship between vibration values, $Sp_a$ and $B_u$ is established through the multivariate linear regression. Therefore, by substituting $Sp_a$ and $B_u$ into the Formula 5, the predicted vibration value $P_v$ (m/s$^2$) can be calculated.

$$p_v = 0.145 \times B_u + 0.404 \times Sp_a - 1.155 \quad \text{Formula 5}$$

Figure 4:
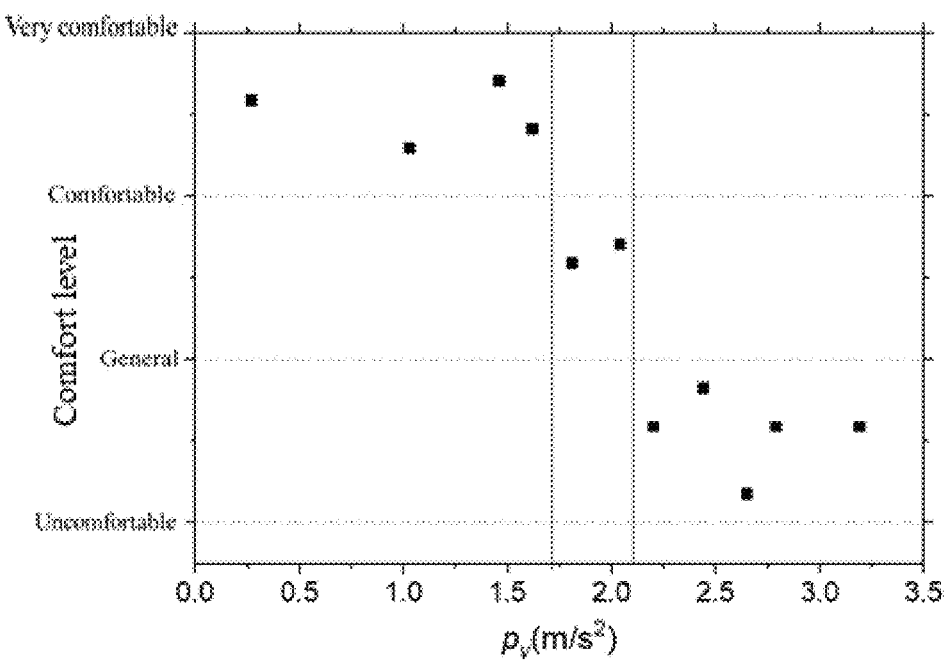
FIG. 4 illustrates determination of comfort levels based on predicted vibration values.

At a step S13, a comfort level is determined. With preliminary studies, vibration values measured on 11 tested road sections are obtained through outdoor tests, and at the same time, comfort levels of vibration perceived by the cyclists are obtained through a questionnaire survey in which 17 volunteers rode on the 11 tested road sections. As shown in FIG. 4, a relationship between vibration and comfort-level threshold is established. By comparing the calculated predicted vibration value P with the vibration vs. comfort-level threshold (Formula 6), the comfort level perceived when riding a bicycle on the asphalt road can be determined.

$$\text{cycling comfort level} = \begin{cases} \text{very comfortable;} & p_v \in (0, 1.78) \\ \text{comfortable;} & p_v \in [1.78, 2.20) \\ \text{uncomfortable;} & p_v \in [2.20, 3.19) \end{cases} \quad \text{Formula 6}$$

Examples 1-19

Examples 1-19 are all carried out on roads paved with asphalt concrete, but are carried out on 19 different urban non-motorized lanes having different surface textures and thus having different vibration levels and providing different comfort levels.

First, a hairbrush is used to remove dust, leaves, garbage and other sundries that covers a surface of each tested road section.

Then, the infrared thermal camera is used to measure the surface temperature of the road in the test zone, and the humidity sensor is used to measure the relative surface humidity of the road. The test results show that the surface temperature and surface humidity of each tested road section respectively range from 5° C. to 30° C. and range from 20% to 70%, which meets test conditions. The detailed results are shown in Table 1.

TABLE 1

Tested surface temperature and surface humidity of each tested road section

| | 1# pressure film | | 2# pressure film | | 3# pressure film | |
|---|---|---|---|---|---|---|
| Example | temperature/° C. | humidity/% | temperature/° C. | humidity/% | temperature/° C. | humidity/% |
| Example 1 | 25 | 45 | 23 | 52 | 23 | 47 |
| Example 2 | 21 | 64 | 24 | 63 | 22 | 60 |
| Example 3 | 22 | 63 | 28 | 46 | 29 | 48 |
| Example 4 | 30 | 56 | 27 | 53 | 30 | 50 |
| Example 5 | 27 | 49 | 30 | 57 | 20 | 45 |
| Example 6 | 29 | 46 | 25 | 59 | 27 | 59 |
| Example 7 | 20 | 50 | 26 | 54 | 26 | 55 |
| Example 8 | 24 | 58 | 20 | 47 | 28 | 57 |
| Example 9 | 28 | 54 | 21 | 50 | 25 | 64 |
| Example 10 | 22 | 61 | 22 | 51 | 21 | 52 |
| Example 11 | 27 | 60 | 29 | 48 | 24 | 46 |
| Example 12 | 29 | 55 | 23 | 49 | 23 | 56 |
| Example 13 | 20 | 57 | 24 | 60 | 22 | 62 |
| Example 14 | 21 | 53 | 22 | 61 | 27 | 58 |
| Example 15 | 30 | 65 | 20 | 62 | 30 | 63 |
| Example 16 | 23 | 51 | 26 | 65 | 20 | 65 |
| Example 17 | 26 | 48 | 28 | 45 | 26 | 51 |
| Example 18 | 27 | 59 | 29 | 46 | 23 | 53 |
| Example 19 | 20 | 62 | 23 | 53 | 28 | 61 |

Then, a shared bicycle of a certain brand is selected, which has a weigh of 25 kg. The rear wheel of the bicycle is placed onto the support frame, spokes of the front wheel and the front fork of the bicycle are fixed together by the fixing belt, and the level bubble is installed horizontally onto a handlebar of the bicycle.

Then, a pressure film of a certain brand is selected, which has a measuring range from 0.5 MPa to 2.5 MPa, and a unit area of 0.016 mm² for a dyeing unit. The pressure film is cut into a rectangle with a width of 10 cm and a length of 20 cm.

Then, the tester first straddles the bicycle and adjusts the angle of the front tire of the bicycle by observing the level bubble. When the level bubble is in a center position, the tester places the front tire of the bicycle vertically onto the pressure film. The tester has a weight of 76 kg. The tester sits steadily on the saddle of the bicycle and keeps the test state stable for 2 minutes. Then, the cyclist removes the front tire of the bicycle, takes away the pressure film, and saves it in the dark environment. Three pressure films are measured at different positions of each tested road section.

Figure 5:
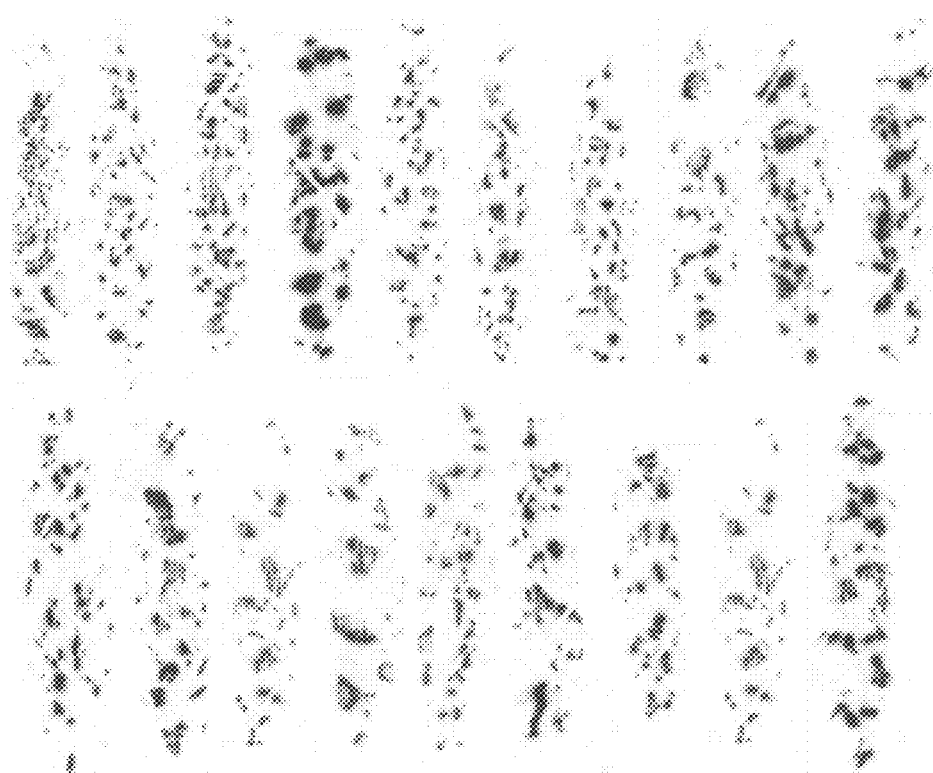
FIG. 5 illustrates digitized films in Examples 1-19.

Then, a digital scanner of a certain brand is used to scan the pressure film in the grayscale mode, and the scanning quality thereof is 600*600 dpi. The 1# digitized pressure films in Examples 1-19 are as shown in FIG. 5.

Then, the unit pixel area of the digitized pressure film is determined based on Formula 1, and the calculation result is that the unit pixel area is 0.003 mm².

$$R_p = \frac{w \times l}{p_w \times p_l}, \quad \text{Formula 1}$$

where Rp represents an area of one pixel of the digitized pressure film corresponding to the real world and has a unit of mm², w and l respectively represent a width and a length of the pressure film in the real world and have a unit of mm, and $p_w$ and $p_l$ respectively represent a number of pixels in a direction of the width of the digitized pressure film and a number of pixels in a direction of the length of the digitized pressure film.

Then, the average bearing area $B_u$ is calculated. First, the contact area $A_c$ between the road and the bicycle tire is calculated based on Formula 2, and then the average bearing area $B_u$ is calculated based on Formula 3, and the results are shown in Table 3.

$$A_c = p \times R_p, \text{ and} \quad \text{Formula 2}$$

$$B_u = \frac{A_c}{n_k}, \quad \text{Formula 3}$$

where p represents a total number of pixels of the digitized pressure film whose grayscale is not equal to 255, and $n_k$ represents a number of regions of the digitized pressure film which are distributed in a granular manner.

TABLE 2

Contact area $A_c$ (mm²) between the road and the bicycle tire

| Example | 1# Pressure film | 2# Pressure film | 3# Pressure film | Average value |
|---|---|---|---|---|
| Example 1 | 440.47 | 405.23 | 453.69 | 433.13 |
| Example 2 | 252.93 | 232.69 | 260.51 | 248.71 |
| Example 3 | 403.24 | 370.98 | 415.30 | 396.52 |
| Example 4 | 267.54 | 246.13 | 275.56 | 263.08 |

TABLE 2-continued

Contact area $A_c$ (mm²) between the road and the bicycle tire

| Example | 1# Pressure film | 2# Pressure film | 3# Pressure film | Average value |
|---|---|---|---|---|
| Example 5 | 251.82 | 231.67 | 259.37 | 247.62 |
| Example 6 | 289.16 | 266.03 | 297.84 | 284.34 |
| Example 7 | 331.36 | 304.85 | 341.30 | 325.83 |
| Example 8 | 355.90 | 327.43 | 366.58 | 349.97 |
| Example 9 | 324.37 | 298.42 | 334.10 | 318.96 |
| Example 10 | 324.03 | 298.11 | 333.75 | 318.63 |
| Example 11 | 365.59 | 336.34 | 376.56 | 359.50 |
| Example 12 | 343.36 | 315.89 | 353.66 | 337.63 |
| Example 13 | 285.15 | 262.34 | 293.71 | 280.40 |
| Example 14 | 217.79 | 200.37 | 224.32 | 214.16 |
| Example 15 | 337.06 | 310.10 | 347.17 | 331.44 |
| Example 16 | 279.57 | 257.21 | 287.96 | 274.91 |
| Example 17 | 390.56 | 359.31 | 402.28 | 384.05 |
| Example 18 | 299.04 | 275.12 | 308.01 | 294.06 |
| Example 19 | 316.35 | 291.04 | 325.84 | 311.08 |

TABLE 3

Average bearing area $B_u$ (mm²) between the road and the bicycle tire

| Example | 1# Pressure film | 2# Pressure film | 3# Pressure film | Average value |
|---|---|---|---|---|
| Example 1 | 3.87 | 3.56 | 3.98 | 3.80 |
| Example 2 | 4.45 | 4.09 | 4.58 | 4.37 |
| Example 3 | 3.46 | 3.19 | 3.57 | 3.41 |
| Example 4 | 6.79 | 6.24 | 6.99 | 6.67 |
| Example 5 | 4.42 | 4.06 | 4.55 | 4.34 |
| Example 6 | 4.21 | 3.88 | 4.34 | 4.14 |
| Example 7 | 6.30 | 5.79 | 6.49 | 6.19 |
| Example 8 | 5.66 | 5.21 | 5.83 | 5.57 |
| Example 9 | 7.03 | 6.47 | 7.24 | 6.91 |
| Example 10 | 5.47 | 5.08 | 5.64 | 5.38 |
| Example 11 | 6.92 | 6.36 | 7.12 | 6.80 |
| Example 12 | 6.28 | 5.77 | 6.47 | 6.17 |
| Example 13 | 8.21 | 7.55 | 8.46 | 8.07 |
| Example 14 | 9.77 | 8.99 | 10.06 | 9.61 |
| Example 15 | 9.17 | 8.44 | 9.45 | 9.02 |
| Example 16 | 8.91 | 8.19 | 9.17 | 8.76 |
| Example 17 | 7.55 | 6.95 | 7.78 | 7.43 |
| Example 18 | 7.05 | 6.48 | 7.26 | 6.93 |
| Example 19 | 12.51 | 11.50 | 12.88 | 12.30 |

Then, the average stress peak distance $Sp_a$ is calculated. Five grayscale value distribution curves are extracted from the digitized pressure film along the forward riding direction by using a digital image analysis software. Each curve is subjected to the lowpass filtering as shown in FIG. 4. The five grayscale value distribution curves are taken every 0.5 cm along the width direction of the image. The average stress peak distance $Sp_a$ of each of the five grayscale value distribution curves is calculated based on Formula 4, and an average value of $Sp_a$ of the five grayscale value distribution curves is reserved, and the results are shown in Table $$Sp_a = \frac{\sum_{i=1}^{n}(x_{i+1} - x_i)}{n}, \quad \text{Formula 4}$$

where n represents the number of stress peaks of one grayscale distribution curve, and $x_{i+1}$ and $x_i$ respectively represents a coordinate of the $(i+1)^{th}$ stress peak and a coordinate of the $i^{th}$ stress peak on the x-axis in the forward riding direction.

TABLE 4

Average stress peak distance $Sp_a$ (mm) between the road and the bicycle tire

| Example | 1 # Pressure film | 2 # Pressure film | 3 # Pressure film | Average value |
|---|---|---|---|---|
| Example 1 | 4.07 | 3.74 | 4.19 | 4.00 |
| Example 2 | 4.42 | 4.07 | 4.55 | 4.35 |
| Example 3 | 4.07 | 3.75 | 4.19 | 4.00 |
| Example 4 | 5.55 | 5.11 | 5.72 | 5.46 |
| Example 5 | 4.11 | 3.78 | 4.23 | 4.04 |
| Example 6 | 5.36 | 4.93 | 5.52 | 5.27 |
| Example 7 | 5.23 | 4.81 | 5.39 | 5.14 |
| Example 8 | 5.13 | 4.72 | 5.28 | 5.04 |
| Example 9 | 5.98 | 5.50 | 6.16 | 5.88 |
| Example 10 | 4.95 | 4.55 | 5.10 | 4.87 |
| Example 11 | 5.30 | 4.87 | 5.46 | 5.21 |
| Example 12 | 5.84 | 5.37 | 6.01 | 5.74 |
| Example 13 | 5.50 | 5.06 | 5.66 | 5.40 |
| Example 14 | 5.75 | 5.29 | 5.92 | 5.65 |
| Example 15 | 6.48 | 5.96 | 6.68 | 6.37 |
| Example 16 | 5.01 | 4.61 | 5.16 | 4.93 |
| Example 17 | 6.57 | 6.04 | 6.76 | 6.46 |
| Example 18 | 6.36 | 5.85 | 6.55 | 6.25 |
| Example 19 | 6.86 | 6.31 | 7.06 | 6.74 |

Then, $Sp_a$ and $B_u$ re substituted into Formula 5 to calculate the predicted vibration value $P_v$ (m/s²), and the results are shown in Table 5.

$$p_v = 0.145 \times B_u + 0.404 \times Sp_a - 1.155 \quad \text{Formula 5}$$

TABLE 5

Predicted vibration value $P_v$ (m/s²) of each bicycle lane

| Example | 1# Pressure film | 2# Pressure film | 3# Pressure film | Average value |
|---|---|---|---|---|
| Example 1 | 1.13 | 0.96 | 0.94 | 1.01 |
| Example 2 | 1.36 | 1.19 | 1.17 | 1.24 |
| Example 3 | 1.08 | 0.91 | 0.89 | 0.96 |
| Example 4 | 2.14 | 1.97 | 1.95 | 2.02 |
| Example 5 | 1.23 | 1.06 | 1.04 | 1.11 |
| Example 6 | 1.69 | 1.52 | 1.50 | 1.57 |
| Example 7 | 1.94 | 1.77 | 1.75 | 1.82 |
| Example 8 | 1.81 | 1.64 | 1.62 | 1.69 |
| Example 9 | 2.34 | 2.17 | 2.15 | 2.22 |
| Example 10 | 1.71 | 1.54 | 1.52 | 1.59 |
| Example 11 | 2.06 | 1.89 | 1.87 | 1.94 |
| Example 12 | 2.18 | 2.01 | 1.99 | 2.06 |
| Example 13 | 2.32 | 2.15 | 2.13 | 2.20 |
| Example 14 | 2.64 | 2.47 | 2.45 | 2.52 |
| Example 15 | 2.85 | 2.68 | 2.66 | 2.73 |
| Example 16 | 2.23 | 2.06 | 2.04 | 2.11 |
| Example 17 | 2.65 | 2.48 | 2.46 | 2.53 |
| Example 18 | 2.49 | 2.32 | 2.30 | 2.37 |
| Example 19 | 3.47 | 3.30 | 3.28 | 3.35 |

Then, the comfort level is determined. The results in Table 5 are compared with the vibration vs. comfort-level threshold provided by Formula 6, so as to determine the comfort level. The result of determining the comfort level in each of Examples 1-19 is shown in Table 6.

$$\text{cycling comfort} = \begin{cases} \text{very comfortable}; & p_v \in (0, 1.78) \\ \text{comfortable}; & p_v \in [1.78, 2.20) \\ \text{uncomfortable}; & p_v \in [2.20, 3.19) \end{cases} \quad \text{Formula 6}$$

Table 6 determination of comfort level perceived when riding a bicycle on each bicycle lane

| Example | Example 1 | Example 2 | Example 3 | Example 4 |
|---|---|---|---|---|
| comfort | very comfortable | very comfortable | very comfortable | comfortable |
| Example | Example 5 | Example 6 | Example 7 | Example 8 |
| comfort | very comfortable | very comfortable | comfortable | very comfortable |
| Example | Example 9 | Example 10 | Example 11 | Example 12 |
| comfort | uncomfortable | very comfortable | comfortable | comfortable |
| Example | Example 13 | Example 14 | Example 15 | Example 16 |
| comfort | uncomfortable | uncomfortable | uncomfortable | uncomfortable |
| Example | Example 17 | Example 18 | Example 19 | |
| comfort | uncomfortable | uncomfortable | uncomfortable | |

The above are merely preferred embodiments of the present disclosure. It should be noted that any modifications and retouches made by those skilled in the art within the principle of the present disclosure shall fall into the protection scope of the present disclosure.

What is claimed is:

1. A method for predicting a vibration of a bicycle when being rode on a road, applied to a system for predicting the vibration of the bicycle,
wherein the system comprises:
a support frame arranged on the road and configured to support a rear wheel of the bicycle in such a manner that the rear wheel of the bicycle is off ground;
a fixing belt configured to fix spokes of a front wheel and a front fork of the bicycle to prevent the front wheel from rotating during a test;
a level bubble installed onto the front fork of the bicycle;

an infrared thermal camera arranged on the road and configured to measure a surface temperature of the road in a road test zone;

a humidity sensor configured to measure a surface relative humidity of the road in the road test zone; and a pressure film arranged in the road test zone, wherein the front wheel of the bicycle is pressed against the pressure film at beginning of the test, wherein the method comprises:

a step S1 of removing sundries covering a surface of a tested asphalt road;

a step S2 of measuring the surface temperature of the road in the road test zone by the infrared thermal camera and measuring the relative surface humidity of the road by the humidity sensor;

a step S3 of placing the rear wheel of the bicycle onto the support frame and fixing the spokes of the front wheel and the front fork of the bicycle together by the fixing belt to avoid a deviation generated during the test;

a step S4 of cutting the pressure film into a required dimension and arranging the pressure film steadily at a test point in such a manner that the pressure film is not in contact with a front tire of the bicycle and the front tire of the bicycle is next to the pressure film before the test starts;

a step S5 of first straddling, by a tester, the bicycle and adjusting an angle of the front tire of the bicycle by observing the level bubble; and then placing, by the tester, the front tire of the bicycle onto the pressure film vertically when it is determined that the front tire of the bicycle is perpendicular to the road;

a step S6 of sitting, by the tester, on a saddle of the bicycle, and keeping a test state stable for a specified period;

a step S7 of removing, by a cyclist, the front tire of the bicycle, and taking away the pressure film and saving the pressure film in a dark environment; and repeating the step S1 through the step S7 to measure at least three pressure films at different positions of each tested road section, and then ending an outdoor test;

a step S8 of digitizing each of the obtained pressure films through a scanner with a scanning mode of a grayscale mode, wherein information recorded by the pressure film in the grayscale mode is converted into a grayscale value ranging from 1 to 255, and a scanning quality is greater than or equal to 600*600 dpi;

a step S9 of determining a unit pixel area of each of the digitized pressure films based on Formula 1;

$$R_p = \frac{w \times l}{p_w \times p_l}, \quad \text{Formula 1}$$

where $R_p$ represents an area of one pixel of the digitized pressure film in a real world and has a unit of mm², w and l respectively represent a width and a length of the pressure film in the real world and have a unit of mm, and $p_w$ and $p_l$ respectively represent a number of pixels in a direction of the width of the digitized pressure film and a number of pixels in a direction of the length of the digitized pressure film;

a step S10 of calculating an average bearing area $B_u$, wherein the average bearing area $B_w$ is defined as a ratio of a contact area $A_c$ to a number $n_k$ of granular contact regions in a contact interface recorded by each of the digitized pressure films; and first, the contact area $A_c$ between the road and a bicycle tire is calculated based on Formula 2, and then the average bearing area $B_u$ is calculated based on Formula 3:

$$A_c = p \times R_p; \text{ and} \quad \text{Formula 2}$$

$$B_u = \frac{A_c}{n_k}, \quad \text{Formula 3}$$

where p represents a total number of pixels of each of the digitized pressure film whose grayscale is not equal to 255, and $n_k$ represents a number of regions of the digitized pressure film which are distributed in a granular manner;

a step S11 of calculating an average stress peak distance $Sp_a$, wherein five grayscale value distribution curves are extracted from each of the digitized pressure films along a forward riding direction by using digital image analysis software, and each of the five grayscale value distribution curves is subjected to a lowpass filtering to improve precision for recognizing a stress peak; according to an inverse correspondence between a grayscale value and a stress value, a grayscale valley corresponds to a stress peak; and the five grayscale value distribution curves are taken every 0.5 cm along a width direction of an image, the average stress peak distance $Sp_a$ of each of the five grayscale value distribution curves is calculated based on Formula 4, and an average value of the calculated $Sp_a$ of the five grayscale value distribution curves is reserved, $$Sp_a = \frac{\sum_{i=1}^{n}(x_{i+1} - x_i)}{n}, \quad \text{Formula 4}$$

where n represents a number of stress peaks of one grayscale distribution curve, and $x_{i+1}$ and $x_i$ respectively represent a coordinate of an $(i+1)^{th}$ stress peak and a coordinate of an $i^{th}$ stress peak on an x-axis in the forward riding direction; and a step S12 of calculating a predicted vibration value $P_v$, wherein $Sp_a$ and $B_u$ are substituted into Formula 5 to calculate the predicted vibration value $P_v$ (m/s²):

$$P_v = 0.145 \times B_u + 0.404 \times Sp_a - 1.155 \quad \text{Formula 5.}$$

2. The method for predicting the vibration of the bicycle when being rode on the road according to claim 1, wherein the test is carried out when the surface temperature of the road is within a range from 15° C. to 30° C. and the relative surface humidity of the road is within a range from 20% to 70%.

3. The method for predicting the vibration of the bicycle when being rode on the road according to claim 1, wherein the specified period in the step S6 is 2 minutes.

4. The method for predicting the vibration of the bicycle when being rode on the road according to claim 1, further comprising:

a step S13 of determining a comfort level when riding the bicycle on the tested road section by comparing the predicted vibration value with a comfort-level threshold.

* * * * *